United States Patent [19]

Takada et al.

[11] Patent Number: 4,665,278

[45] Date of Patent: May 12, 1987

[54] HEAT-RESISTANT PHOTOELECTRIC CONVERTER

[75] Inventors: Jun Takada, Kobe; Minori Yamaguchi, Akashi; Yoshihisa Tawada, Kobe, all of Japan

[73] Assignee: Kanegafuchi Kagaku Kogyo Kabushiki Kaisha, Osaka, Japan

[21] Appl. No.: 744,599

[22] Filed: Jun. 14, 1985

[30] Foreign Application Priority Data

Jun. 15, 1984 [JP] Japan .................................. 59-124331

[51] Int. Cl.$^4$ .......................................... H01L 31/04
[52] U.S. Cl. .................................. 136/256; 136/258; 136/259; 357/30; 357/71; 357/59; 29/572; 427/74; 427/89
[58] Field of Search ............... 136/256, 258 AM, 259; 357/30, 59 C, 71; 29/572; 427/74, 89

[56] References Cited

U.S. PATENT DOCUMENTS

| | | | |
|---|---|---|---|
| 4,053,326 | 10/1977 | Forrat .................................. | 136/256 |
| 4,058,418 | 11/1977 | Lindmayer .......................... | 148/175 |
| 4,251,289 | 2/1981 | Moustakas et al. ................. | 136/255 |
| 4,584,427 | 4/1986 | Mackamul et al. ................. | 136/256 |

FOREIGN PATENT DOCUMENTS 57-01264  1/1982  Japan ........................... 136/258 AM Primary Examiner—Aaron Weisstuch
Attorney, Agent, or Firm—Armstrong, Nikaido, Marmelstein & Kubovcik

[57] ABSTRACT

A heat-resistant thin film photoelectric converter comprising a semiconductor layer, front and back electrodes, and a diffusion-blocking layer, the diffusion-blocking layer being provided between the semiconductor and at least one said electrode, and its preparation. The diffusion-blocking layer is of a metal selected from the Group IVA metals and Group VA metals of the Periodic Table. The converter avoids the reduction in efficiency due to the diffusion of metal or metallic compound from the electrode into the semiconductor.

8 Claims, 1 Drawing Figure hν

HEAT-RESISTANT PHOTOELECTRIC CONVERTER

BACKGROUND OF THE INVENTION

The present invention relates to a heat-resistant thin film photoelectric converter and the preparation thereof.

A thin film photoelectric converter is used for a solar cell, photo-detector, photo-receptor for electrophotography, laser, electro-luminescent device, or the like. A thin film photoelectric converter contains fundamentally a layer of semiconductor and electrodes which come in contact with the layer of semiconductor. As an electrode, a transparent electrode and/or a metal electrode is used. As the material for the transparent electrode, there hitherto has been used a metallic compound such as ITO, ITO/SnO$_2$, SnO$_2$, In$_2$O$_3$, Cd$_x$SnO$_y$ (x=0.5 to 2, y=2 to 4), Ir$_z$O$_{1-z}$ (z=0.33 to 0.5), or the like. A metal electrode of a metal such as Al, stainless steel, Fe, Ni, Cu, brass, Zn, Ag, or the like is provided on the semiconductor layer.

In FIG. 1, as an example of a photoelectric converter, a typical structure of a solar cell is illustrated. A solar cell has, as shown in FIG. 1, a transparent electrode 2 of a metallic compound (e.g. a metal oxide) on a transparent substrate 1 (e.g. glass), and thereon, a layer of p-type semiconductor 3, a layer of i-type semiconductor 4, and a layer of an n-type semiconductor 5 are provided. On the layer of n-type semiconductor 5, a layer of metal electrode 6 is provided as a back electrode. Light comes into the semiconductor layer through the transparent electrode and is absorbed by the semiconductor so as to generate electric power. A portion of the light is not absorbed in the semiconductor layer and reaches the back electrode and is reflected back to be absorbed in the semiconductor layer.

When a conventional solar cell is used at a temperature above about 50° C., the metal (such as Al, Cu, brass, zinc, or Ag,) or the metallic compound of the electrodes is diffused to the semiconductor layer, so that the efficiency of the semiconductor is lowered. Especially, when an amorphous or microcrystalline semiconductor is used, the efficiency of the amorphous or microcrystalline semiconductor is notably lowered. For instance, in the case where the solar cell is used in the open air, the temperature at the surface of the solar cell reaches about 80° C., so that the efficiency of the semiconductor is remarkably lowered.

There are some metals which do not diffuse into the semiconductor layer when used as an electrode. Examples of such metals are Cr, Ni, Fe, and stainless steel. However, those metals have low electrical conductivity or low reflectivity compared with the above-mentioned metals such as Al, Cu, brass, Zn, and Ag. Thus, a solar cell having a back electrode of Cr, Ni, Fe, or stainless steel has a drawback due to ohmic loss in the electrode or poor reflection of light at the electrode. Any type of photoelectric converter, not only a solar cell, has the disadvantage described above when used at a high temperature.

An object of the present invention is to provide a heat-resistant thin film photoelectric converter, which does not suffer reduction of efficiency due to diffusion of metal or metallic compound from the electrode to the semiconductor layer, under the conditions that the ohmic loss in the back electrode and the loss of light due to poor reflection at the back electrode are not increased.

SUMMARY OF THE INVENTION

The present invention relates to a heat-resistant thin film photoelectric converter which comprises a semiconductor, front and back electrodes, and a diffusion-blocking layer. The diffusion-blocking layer is provided between the semiconductor layer and at least one of the said electrodes. The diffusion-blocking layer is a metal selected from the group consisting of Group IVA metals and Group VA metals of the Periodic Table.

DETAILED DESCRIPTION

Figure 1:
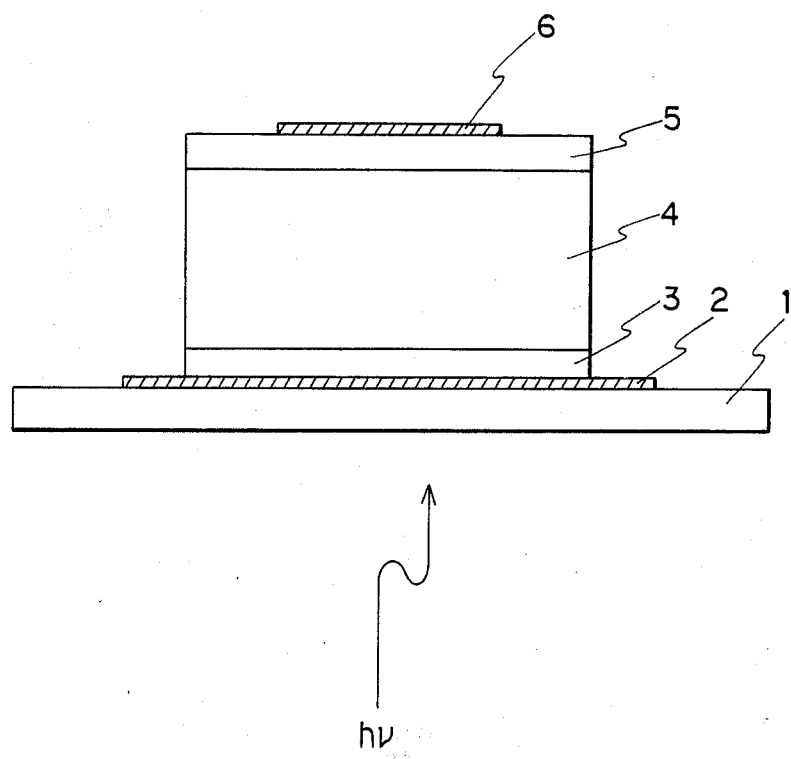
FIG. 1 is a schematic view of a conventional thin film photoelectric converter.

In the heat-resistant thin film photoelectric converter of the present invention, a diffusion-blocking layer is provided between a layer of semiconductor and a layer of electrode. In the invention, the diffusion-blocking layer can be provided on any side of the semiconductor.

Such a diffusion-blocking layer prevents diffusion of the metal or metallic compound used as the electrode from the electrode layer to the layer of semiconductor. The component of the diffusion-blocking layer is a metal of the Groups IVA and VA of the Periodic Table. Specific examples of those metals are Sn and Sb.

In the present invention, a preferable thickness of the diffusion-blocking layer is 5 Å to 1000 Å, especially, 5 Å to 500 Å. When the thickness is below 5 Å, a uniform and homogeneous layer cannot be obtained and the diffusion of the metal from the electrode layer to the semiconductor layer cannot be fully prevented. When the thickness is above 1000 Å, the series electrical resistance of the layer is increased, reflectivity at the back electrode is decreased, and too much time for depositing the layer is required.

The thickness of the diffusion-blocking layer can be measured by using a crystal sensor, or determined from surface analysis by means of SIMS (Secondary Ion Mass Spectroscopy).

The semiconductor in the invention is preferably an amorphous or microcrystalline semiconductor, because the reduction of the characteristics of the amorphous or microcrystalline semiconductor at high temperature is remarkably improved.

Semiconductor layers of thickness in the range of 0.02 to 100 μm can be used in the present invention.

With respect to the composition of the semiconductor, silicon or a silicon alloy containing hydrogen, fluorine, carbon, nitrogen, oxygen, germanium, or tin is preferably used. Specific examples of such semiconductors are as follows: a-Si:H; a-Si:F:H; a-SiGe:H; a-SiSn:H; a-SiN:H; a-SiGe:F:H; a-SiSn:F:H; a-Si:N:F:H; a-SiC:H; a-SiC:F:H; a-SiO:H; a-SiO:F:H; μc-Si:H; and μc-Si:F:H; wherein a- indicates amorphous and μc- indicates microcrystalline.

In the present invention, a semiconductor junction structure of p-i-n, p-n, or Schottky type can be used. For the semiconductor layer which comes into contact with the diffusion-blocking layer, n-type is preferable because the improvement of the characteristics in the invention is notable. Electrodes are placed on the incident side of light and on the back side. The electrode on the incident side of light is transparent and is made of a metallic compound such as ITO (film of In$_2$O$_3$ containing SnO$_2$), ITO/SnO$_2$, SnO$_2$, In$_2$O$_3$, Cd$_x$SnO$_y$ (x=0.5 to 2, y=2 to 4), Ir$_z$O$_{1-z}$ (z=0.33 to 0.5), or the like, but other materials can be used.

The electrode provided on the back side is made of metal or a metal alloy. Any metal or metal alloy is usable insofar as it is usually used as a material of a back electrode. For instance, Al, Ag, Au, Cu, brass, Zn, or the like is usable as a back electrode. Other than those metals, any metal or metal alloy having the same physico-chemical properties can be used. However, a material which forms silicide, such as Li, Na, Ka, Rb, Cs, Mg, Ca, Sr, Ba, Sc, Y, La, Ti, Zr, Hf, V, Nb, Ta, Cr, Mo, W, Mn, Re, Fe, Ru, Os, Co, Rh, Ir, Ni, Pd, or Pt is less suitable as an electrode material since such metals have low electrical conductivity and/or low reflectivity. A metal having an electrical conductivity of $0.1 \times 10^5$ to $6.2 \times 10^5 \Omega^{-1} \text{cm}^{-1}$ can be used. The electrical conductivity is preferably above $1.5 \times 10^5 \Omega^{-1} \text{cm}^{-1}$, and especially, above $3.0 \times 10^5 \Omega^{-1} \text{cm}^{-1}$ so that the ohmic loss in the electrode is very small.

Another consideration in selecting a material for a back electrode is its reflectivity of light. A metal having a reflectivity of more than 20% to 99% for light of wavelength of 700 nm can be used, but a reflectivity of more than 50% to 99% is preferable. Examples of such metal are Ag, Au, Al, and Cu. Reflectivity in the present invention is defined as the reflectivity at the interface between a layer of hydrogenated amorphous silicon (a-Si:H) and an electrode. The reflectivity R$_{max}$ is given by the following formula:

$$R_{max} = \frac{(n_1 - n_2)^2 + k_2^2}{(n_1 + n_2)^2 + k_2^2}$$

wherein, n$_1$ is the real part of the complex reflective index of hydrogenated amorphous silicon (a-Si:H), n$_2$ and k$_2$ are respectively the real and imaginary parts of the complex reflective index of the metal.

Metals which satisfy the above condition are Ag, Au, Al, Cu, and Zn. Among those metals, Ag, Au, Al, and Cu are preferable for the back electrode.

In addition, both the monolayer type and the multilayer type of back electrode can be used. In the multilayer type, the layer which directly contacts the diffusion-blocking layer in the invention should possess high reflectivity and high conductivity so that the light is fully reflected at the contact surface and the series resistance of the interface is not increased.

The preparation of a heat-resistant thin film photoelectric converter in the present invention is explained as follows:

The semiconductor junction structure is assumed, for example, to be a p-i-n type as is used for solar cells. The surface of the p-type semiconductor faces a light-incident window. The entire thickness of the semiconductor in the photoelectric converter of the invention is 0.02 μm to 100 μm.

In the present invention, not only the p-i-n type semiconductor as mentioned above, but also a Schottky type or a p-n type semiconductor can be used. For solar cells, either a hetero-junction type or homo-junction type can be used.

The amorphous p-i-n type semiconductor film is deposited on a transparent electrode which is provided on a transparent substrate. The p-layer contacts the transparent electrode.

The diffusion-blocking layer of the invention is deposited by means of electron-beam-evaporation onto the amorphous p-i-n semiconductor film. Alternatively, the sputtering method can be employed.

The material to be deposited on the semi-conductor is a metal selected from the Groups IVA and VA metals of the Periodic Table.

After depositing the diffusion-blocking layer of the invention, a back electrode is deposited on the layer.

The heat-resistant thin film photoelectric converter prepared by the above-described process has the advantage that its conversion efficiency is not lowered by heating. Besides, annealing the converter at a temperature of 80° C. to 400° C. for 0.5 to 4 hours causes the diffusion-blocking layer to come into closer contact with the semiconductor and the electrode, so that the series resistance at the interface decreases.

The heat-resistant thin film photoelectic converter of the present invention can preferably be utilized as a solar cell or a photo-detector, since the ambient temperature of solar cells and photo-detector often becomes more than 50° C. Especially, with respect to solar cells, the ambient temperature reaches up to about 80° C. in the open air, so that the advantage of the present invention is emphasized.

In addition, another advantage of the invention is that the loss of light due to poor reflection at the back electrode for the longer wavelengths of light is very small because the diffusion-blocking layer is comparatively thin.

A heat-resistant thin film photoelectric converter of the present invention and its preparation are exemplified by the following Examples.

It is not to be understood that the present invention is not limited to the Examples, and various changes and modifications may be made in the invention without departing from the spirit and scope thereof.

EXAMPLES 1 TO 12

On a glass substrate of 1.1 mm thickness, a transparent ITO/SnO$_2$ electrode of 850 Å was provided.

An amorphous p-layer of 100 Å, an i-layer of 500 Å, and a microcrystalline n-layer of 500 Å were deposited, respectively, by glow-discharge decomposition. The p-layer was deposited from a mixed gas of SiH$_4$, CH$_4$, B$_2$H$_6$, and H$_2$, the i-layer was deposited from a gas of SiH$_4$, and the n-layer was deposited from a mixed gas of SiH$_4$, PH$_3$, and H$_2$. The pressure of the gas was about 1 Torr, and the temperature of the substrate was 200° C.

Sn or Sb was then deposited by means of electron-beam-evaporation, under $5 \times 10^{-6}$ Torr, onto the microcrystalline n-layer. The deposited layers were of 30 Å, 50 Å, 100 Å, 300 Å, 500 Å and 1000 Å for each metal. Thereafter an aluminum electrode of 2000 Å was deposited on the Sb or Sn layer.

Twelve solar cells thus prepared were heated for 4 hours at 230° C., and their characteristics were measured before and after heating by a solar simulator under a condition of AM-1, 100 mW/cm$^2$.

The conversion efficiencies after heating were decreased for every solar cell. However, the decreased efficiencies were not less than 85% of the initial values.

COMPARATIVE EXAMPLE 1

A diffusion-blocking layer was not provided in the solar cell which was prepared by the same process as in Example 1. Characteristics of the fabricated solar cell was measured before and after heating at 230° C. for 4 hours. The value of conversion efficiency after heating was decreased to 10% of the initial value.

What is claimed is:

1. A heat-resistant thin film photoelectric converter comprising an amorphous semiconductor layer, front and back electrodes, and a diffusion-blocking layer, said diffusion-blocking layer being provided between the amorphous semiconductor layer and at least one of said electrodes, and being of a metal selected from the group consisting of Sn, Pb, and Bi.

2. The converter of claim 1, wherein the thickness of the diffusion-blocking layer is 5 Å to 1000 Å.

3. The converter of claim 1, wherein the thickness of the diffusion-blocking layer is 5 Å to 500 Å.

4. The converter of claim 1, wherein said amorphous semiconductor is an alloy of silicon and at least one member selected from the group consisting of H, F, N, C, O, Ge, and Sn.

5. The converter of claim 1, wherein said one electrode of the photoelectric converter is a metal electrode, the metal of said metal electrode having an electrical conductivity of $0.1 \times 10^5$ to $6.2 \times 10^5 \Omega^{-1} cm^{-1}$ and a reflectivity of 20% to 99% at a wavelength of light of 700 nm.

6. The converter of claim 5, wherein the metal of said metal electrode has a conductivity of $3.0 \times 10^5$ to $6.2 \times 10^5 \Omega^{-1} cm^{-1}$ and reflectivity of 50 to 99% at a wavelength of light of 700 nm.

7. The converter of claim 1, wherein the diffusion-blocking layer is a metal selected from the group consisting of Sn and Pb.

8. In a process for preparing a heat-resistant thin film photoelectric converter comprising an amorphous semi-conductor layer and front and back electrodes, the improvement which comprises forming a diffusion-blocking layer of a metal selected from the group consisting of Sn, Pb, and Bi between the amorphous semiconductor layer and at least one of said electrodes, and annealing the fabricated converter for 0.5 to 4 hours at a temperature of 80° C. to 400° C.

* * * * *